United States Patent
Tong et al.

(10) Patent No.: US 10,890,654 B2
(45) Date of Patent: Jan. 12, 2021

(54) RADAR SYSTEM COMPRISING COUPLING DEVICE

(71) Applicant: NXP USA, INC., Austin, TX (US)

(72) Inventors: Ziqiang Tong, Ottobrunn (DE); Shamsuddin Ahmed, Munich (DE)

(73) Assignee: NXP USA, INC., Austin, TX (US)

( * ) Notice: Subject to any disclaimer, the term of this patent is extended or adjusted under 35 U.S.C. 154(b) by 272 days.

(21) Appl. No.: 16/176,308

(22) Filed: Oct. 31, 2018

(65) Prior Publication Data
US 2019/0187273 A1 Jun. 20, 2019

(30) Foreign Application Priority Data

Dec. 19, 2017 (EP) ..................................... 17208496

(51) Int. Cl.
*G01S 13/87* (2006.01)
*H01P 5/18* (2006.01)
(Continued)

(52) U.S. Cl.
CPC .............. *G01S 13/87* (2013.01); *G01S 7/032* (2013.01); *G01S 13/878* (2013.01);
(Continued)

(58) Field of Classification Search
CPC ........ G01S 13/87; G01S 13/878; G01S 7/032; G01S 13/931; G01S 2007/028; G01S 13/003; G01S 13/02; G01S 7/03; G01S 7/4004; H01P 5/18; H01P 5/227; H01P 5/222; H03H 7/18; H03B 5/1215
See application file for complete search history.

(56) References Cited

U.S. PATENT DOCUMENTS

| 5,008,678 A | 4/1991 | Herman |
| 7,869,778 B2* | 1/2011 | Cavin ....................... H03L 7/23 |
| | | 455/141 |

(Continued)

FOREIGN PATENT DOCUMENTS

| EP | 2881752 A1 | 6/2015 |
| WO | 2017054962 A1 | 4/2017 |

OTHER PUBLICATIONS

Kaifas, T., "On the Design of a Single-Layer Wideband Butler Matrix for Switched-Beam UMTS System Applications" IEEE Antennas and Propagation Magazine, vol. 48, No. 6, Dec. 2006.

*Primary Examiner* — Olumide Ajibade Akonai

(57) ABSTRACT

A radar system (200, 200a) and a method of operating a radar system are described, the radar system (200, 200a) comprising: a plurality of ICs (210, 220), each IC (210, 220) comprising: a respective LO output (212, 222) for selectively outputting a respective LO signal, and a respective LO input (214, 224); and a coupling device (230, 330), the coupling device (230, 330) comprising: a plurality of inputs (232, 234; 341, 342, 351, 352), each input being coupled to the LO output (212, 222) of a respective IC (200, 200a), and a plurality of outputs (236, 238; 363, 364, 373, 374), each output being coupled to the LO input (212, 222) of a respective IC (214, 224); wherein the coupling device (230, 330) is configured such that a LO signal arriving at any one of said plurality of inputs (232, 234; 341, 342, 351, 352) is distributed to each of said plurality of outputs (236, 238; 363, 364, 373, 374). The coupling device (230, 330) may comprise at least one directional coupler.

20 Claims, 2 Drawing Sheets

(51) Int. Cl.
*G01S 7/03* (2006.01)
*H01P 5/22* (2006.01)
*G01S 13/931* (2020.01)
*H03H 7/18* (2006.01)
*G01S 7/02* (2006.01)

(52) U.S. Cl.
CPC .............. *G01S 13/931* (2013.01); *H01P 5/18* (2013.01); *H01P 5/227* (2013.01); *G01S 2007/028* (2013.01); *H01P 5/222* (2013.01); *H03H 7/18* (2013.01)

(56) References Cited

U.S. PATENT DOCUMENTS

| | | | |
|---|---|---|---|
| 10,128,894 B1* | 11/2018 | O'Brien | H04B 1/403 |
| 2008/0001810 A1* | 1/2008 | Forstner | H03D 7/14 |
| | | | 342/175 |
| 2009/0146765 A1 | 6/2009 | Chen et al. | |
| 2012/0154203 A1* | 6/2012 | Vacanti | G01S 13/44 |
| | | | 342/149 |
| 2015/0002330 A1* | 1/2015 | Binzer | G01S 7/032 |
| | | | 342/175 |
| 2015/0153445 A1 | 6/2015 | Jansen | |
| 2016/0170010 A1 | 6/2016 | Ygnace et al. | |
| 2017/0023663 A1* | 1/2017 | Subburaj | G01S 13/931 |
| 2017/0090015 A1* | 3/2017 | Breen | G01S 7/032 |

* cited by examiner

RADAR SYSTEM COMPRISING COUPLING DEVICE

CROSS-REFERENCE TO RELATED APPLICATIONS

This application claims the priority under 35 U.S.C. § 119 of European Patent application no. 17208496.4, filed on 19 Dec. 2017, the contents of which are incorporated by reference herein.

FIELD OF THE INVENTION

The present invention relates to a radar system comprising a coupling device.

BACKGROUND OF THE INVENTION

In high performance automotive radar systems, angular resolution and/or SNR may be increased by cascading multiple radar transceiver chips to increase the number of physical receiver and/or transmitter channels. To build a coherent system, it is necessary to have a single source of local oscillator (LO) signal among all the transceiver chips. In a cascaded multi-chip radar sensor, one transceiver chip is designated as a master IC (integrated circuit), while the other transceiver chips are designated as slave ICs. The LO signal is generated from the master IC and distributed to all the master and slave ICs through one or more T-junction power dividers. A failure in the VCO/PLL block of the master IC causes a malfunction of the radar sensor because the LO signal is no longer distributed to the slave ICs.

SUMMARY OF THE INVENTION

Aspects of the invention are set out in the accompanying claims. Combinations of features from the dependent claims may be combined with features of the independent claims as appropriate and not merely as explicitly set out in the claims.

According to a first aspect of the invention, there is provided a radar system comprising:
 a plurality of ICs, each IC comprising:
 a respective LO output for selectively outputting a respective LO signal, and
 a respective LO input; and
 a coupling device, the coupling device comprising:
 a plurality of inputs, each input being coupled to the LO output of a respective IC, and
 a plurality of outputs, each output being coupled to the LO input of a respective IC;
 wherein the coupling device is configured such that a LO signal arriving at any one of said plurality of inputs is distributed to each of said plurality of outputs.

By enabling the common LO signal for the plurality of radar ICs (for example, transceiver ICs) of the radar system to be sourced from any one of the plurality of radar ICs, the present invention may allow reconfigurability of the ICs of the radar system between master and slave functionality, together with improvements in safety, thermal dissipation and system performance, a reduction in the influence of process variations and adaptation of the radar system to a range of different applications.

For example, in the event of a failure in one of the ICs designated as master and providing the LO signal for the radar system, one of the ICs previously designated as a slave IC may be reconfigured as master to provide the common LO signal, thereby improving reliability of the system. This may in turn increase the safety of any apparatus or process reliant on the radar system as a sensor. This is particularly important in autonomous vehicle applications.

In a master-slave system, the master IC typically consumes more power and generates more heat than each of the slave ICs. By enabling the LO signal to be sourced from any one of the plurality of radar ICs, the present invention may allow the function of master IC to be switched between different ICs of the radar system, which may in turn improve system performance by improving heat dissipation and balancing power consumption between the plurality of ICs.

In addition, since the common LO signal for the plurality of radar ICs of the radar system may be sourced from any one of the plurality of radar ICs, system performance may be improved by selecting the master IC from the plurality of ICs based on performance, thereby reducing the influence of process variation.

Finally, the present invention may allow the radar system to be adapted for use in different applications. For example, in an automotive radar sensor, it may be desirable to adapt the system to selectively provide both bumper effects compensation and ground reflection compensation. For example, various different delay lines may be provided for coupling LO signals from different respective ICs to a respective input of the coupling device, so that these different compensations may be implemented by selecting a different IC as the LO signal source for each effect.

The coupling device may comprise at least one directional coupler.

The at least one directional coupler may comprise a branch line coupler.

The at least one directional coupler may comprise a rat race coupler.

The at least one directional coupler may comprise a waveguide coupler.

The coupling device may comprise a plurality of directional couplers.

The radar system may be configured such that only one of said plurality of ICs outputs a respective LO signal when the radar system is in use acquiring radar data.

In some embodiments, each one of said plurality of ICs is selectively configurable (i) as a master IC configured to output a common LO signal at its respective LO output and (ii) as a slave IC configured to receive the common LO signal from a master IC via said coupling device at its respective LO input.

In some embodiments, a first IC of said plurality of ICs is configured as a master IC and outputs a first common LO signal at its respective LO output, and each of the other ICs of said plurality of ICs is configured as a slave IC and receives said first common LO signal from said first IC via said coupling device at its respective LO input.

Said first IC may be reconfigurable as a slave IC for receiving a second common LO signal from one of the other ICs via the coupling device at its respective LO input, and each of said other ICs may be selectively reconfigurable as a master IC for outputting said second common LO signal.

Each IC of said plurality of ICs may be comprised in a transceiver, receiver or transmitter.

Each IC of said plurality of ICs may be a transceiver IC.

Each IC of said plurality of IC may be comprised in a respective chipset, in particular a transceiver chipset, a receiver chipset or a transmitter chipset.

The radar system may comprise a printed circuit board, wherein said ICs are mounted to said printed circuit board, wherein said coupling device is provided on said printed circuit board.

The radar system may further comprise phase compensation circuitry for compensating a phase difference between the outputs of the coupling device.

The phase compensation circuitry may comprise at least one delay line. The delay line may be provided on a printed circuit board.

The phase compensation circuitry may comprise at least one phase rotator. The phase rotator may be implemented in one or more of said plurality of ICs.

The phase compensation circuitry may comprise a plurality of phase rotators.

The radar system may further comprise:

first circuitry for introducing a first phase shift into a signal received at a first respective input of the plurality of inputs of the coupling device from a first IC of the plurality of ICs, and second circuitry for introducing a second phase shift into a signal received at a second respective input of the plurality of inputs of the coupling device from a second IC of the plurality of ICs, wherein said second phase shift is greater than said first phase shift.

The first and second circuitry may comprise respective first and second delay lines. The first and second delay lines may be provided on a printed circuit board.

The first and second circuitry may be provided in said first and second ICs respectively. For example, the first and second circuitry may be provided by phase rotators in ICs comprised in the first and second ICs.

According to a second aspect of the invention, there is provided an autonomous vehicle comprising a radar system as defined above.

According to a third aspect of the invention, there is provided a method of operating a radar system, the radar system comprising: a plurality of radar ICs, each IC comprising a respective LO output for selectively outputting a respective LO signal, and a respective LO input; and a coupling device, the coupling device comprising: a plurality of inputs, each input being coupled to the LO output of a respective IC, and a plurality of outputs, each output being coupled to the LO input of a respective IC; wherein the coupling device is configured such that an LO signal arriving at any one of said plurality of inputs is distributed to each of said plurality of outputs; the method comprising:

operating the radar system in a first configuration, in which a first IC of said plurality of ICs is configured to output a common LO signal, and the other ICs of said plurality of ICs are configured to receive said common LO signal from said first IC; and reconfiguring the radar system to a second configuration, in which a second IC of said plurality of ICs is reconfigured to output a common LO signal.

The first IC may be reconfigured to receive said common LO signal from said second IC.

BRIEF DESCRIPTION OF THE DRAWINGS

Embodiments of the present invention will be described, by way of example only, with reference to the accompanying drawings in which like reference signs relate to like elements and in which.

DETAILED DESCRIPTION

Figure 1:
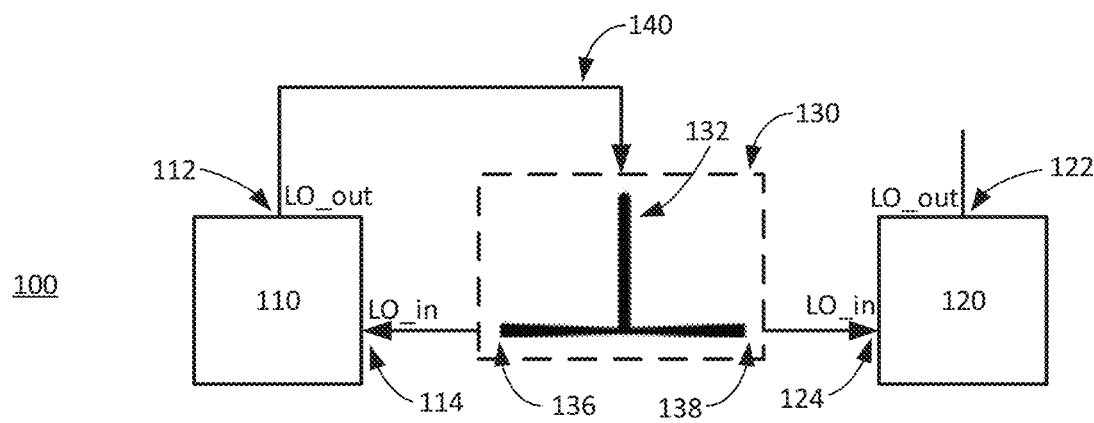
FIG. 1 illustrates an example configuration of a radar system useful for understanding the present invention.

FIG. 1 illustrates an example configuration of a radar system 100, in the form of a cascaded radar front-end for MMW radar, useful for understanding the present invention. The system 100 comprises a master transceiver 110 in the form of a master integrated circuit (IC), a slave transceiver 120, in the form of a slave integrated circuit (IC), and a T-junction power divider 130. Typically, each IC 110, 120 includes multiple operational transmit (TX) ports and multiple receiver (RX) ports (not shown). In practice, the system 100 would include a plurality of slave transceivers, but only one is shown in this example.

The master IC 110 generates a common local oscillator (LO) signal, which is output from an LO output port 112 of the master IC 110. The common LO signal may have a frequency of, for example, 38 GHz. The common LO signal 140 is distributed via a T-junction 130 to the respective LO input ports 114, 124 of the master IC 110 and slave IC 120, and is used for the transmit (TX) amplifiers and receiver (RX) mixers (not shown in FIG. 1) of the ICs 110, 120. The T-junction power divider 130 comprises an input 132 and two outputs 136, 138. The input 132 of the T-junction power divider 130 is coupled to the LO output port 112 of the master IC 110 via line 140. The two outputs 136, 138 are coupled to the respective LO input ports 114, 124 of the master and slave ICs 110, 120. The LO signal received at the input 132 of the T-junction 130 is distributed to the two outputs 136, 138 of the T-junction with roughly equal power. The LO output port 122 of the slave IC 120 is not used in the system 100 shown in FIG. 1.

Typically, the master IC 110 also transmits other signals (not shown) to the slave IC 120, such as a common clock signal, used as a time base for synchronization of the sampling moments on the ADCs on the master and slave ICs, and timing control signals, for example for triggering a timing engine within the slave IC. Typically, the radar system 100 also includes other components (not shown), such as a crystal oscillator for providing a reference clock signal for the radar system 100, and a controller for controlling the data acquisition process for the radar system 100 and receiving data from the master and slave ICs 110, 120.

In the radar system 100 shown in FIG. 1, once an IC is selected as master chip, it is not possible to reconfigure the IC as a slave IC. Therefore a functional failure in the VCO/PLL (voltage controlled oscillator/phase locked loop) block of the master IC 110, which is critical for generating the LO signal for the slave IC 120, results in a failure of the whole system 100.

Figure 2:
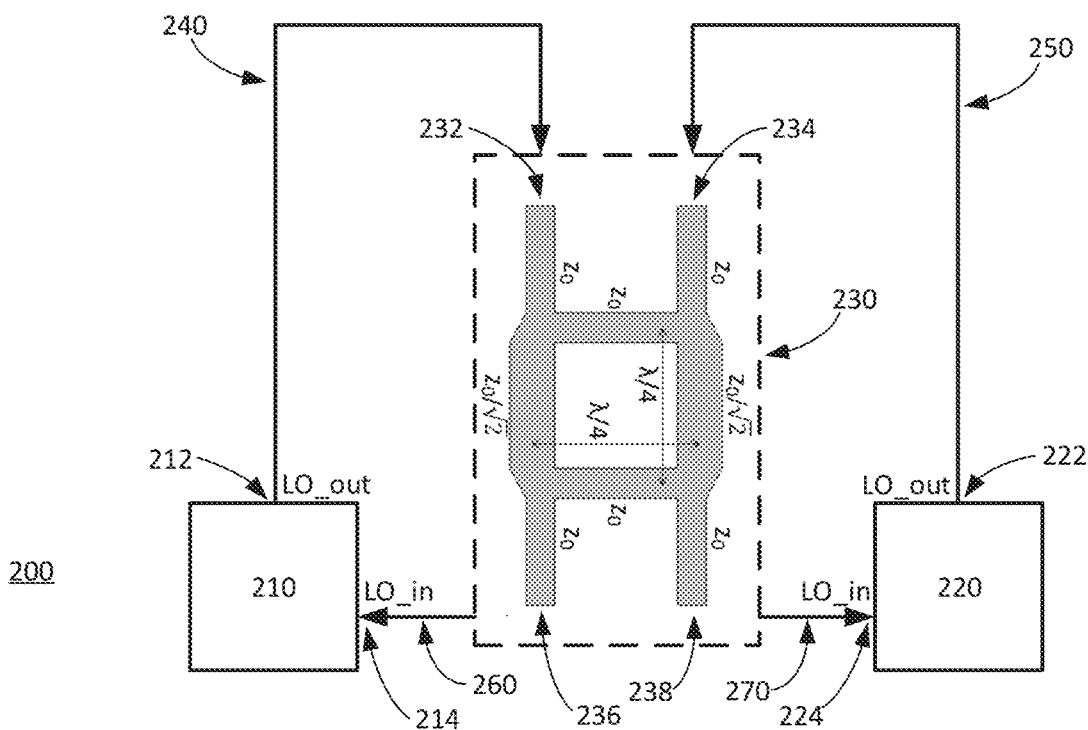
FIG. 2 illustrates a configuration of a radar system according to an example embodiment of the present invention.

FIG. 2 illustrates an example configuration of a radar system 200 according to an embodiment of the present invention. The system 200 comprises a plurality of integrated circuits (ICs), including a first IC 210 in the form of a first transceiver, a second IC 220 in the form of second transceiver, and a coupling device 230 in the form of a directional coupler 230. The first and second ICs 210, 220 may be MMICs (monolithic microwave integrated circuits). Typically, each IC 210, 220 includes multiple operational transmit (TX) ports and multiple receiver (RX) ports (not shown). Although only two transceivers 210, 220 are shown in FIG. 2, other embodiments of the invention may include further transceivers in addition to the first and second transceivers 210, 220 shown in this example embodiment. Furthermore, in other embodiments, each of the plurality of ICs 110, 120 may be provided in the form of a chip set (i.e. a combination of dedicated transmitter and/or receiver ICs).

The first transceiver 210 comprises an LO output port (LO_out) 212 for selectively outputting an LO signal generated internally by the first transceiver 210, and an LO input port (LO_in) 214 for receiving an LO signal. Similarly, the second transceiver 220 comprises an LO output port (LO_out) 222 for selectively outputting an LO signal generated internally by the second transceiver 220, and an LO input port (LO_in) 224 for receiving an LO signal.

The coupling device 230 comprises first and second inputs 232, 234 and first and second outputs 236, 238. The first input 232 of the coupling device 230 is coupled via a transmission line 240 to the LO output port 212 of the first transceiver 210. The second input 234 of the coupling device 230 is coupled via transmission line 250 to the LO output port 222 of the second transceiver 220. The first output 236 of the coupling device 230 is coupled via transmission line 260 to the LO input port 214 of the first transceiver 210. The second output 238 of the coupling device 230 is coupled via transmission line 270 to the LO input port 224 of the second transceiver 220. The transmission lines 240, 250, 260, 270 may be implemented, for example, by a microstrip line. A local oscillator signal received at either one of the first and second inputs 232, 234 of the coupling device 230 is distributed to both of the first and second outputs 236, 238 of the coupling device 230. The coupling device 230 therefore enables a common LO signal for the radar system 200 to be sourced from any one of the plurality of transceivers 210, 220.

The coupling device 230 illustrated in FIG. 2 is a directional coupler, in the form of a branch line coupler. The branch line coupler represented in FIG. 2 comprises two parallel transmission lines coupled together by branch lines spaced apart by λ/4. The power at each output 236, 238 of the coupling device 230 may be approximately equal.

The following matrix specifies the general behaviour of the directional coupler:

$$[S] = \frac{-1}{\sqrt{2}}\begin{bmatrix} 0 & j & 1 & 0 \\ j & 0 & 0 & 1 \\ 1 & 0 & 0 & j \\ 0 & 1 & j & 0 \end{bmatrix}$$

in which the matrix elements specify the transmission/coupling coefficients between the input/output ports of the directional coupler (input port 232, output port 236, output port 238, input port 234). In the ideal scenario, the power at each output is half the power at the input. One of the features of the directional coupler 230 is the isolation between the input ports 232, 234, such that the signal from input 232 is not coupled to input 234, and vice versa.

The phase difference between the outputs 236, 238 of the coupling device 230 may be compensated by phase compensation circuitry 260, 270 to ensure that the LO signals arriving at each LO input 212, 222 have the correct phase relationship. In this embodiment, the phase compensation circuitry is in the form of delay line 260, 270 on the PCB. Alternatively, the phase compensation circuitry may be provided by phase rotators or phase shifters in the ICs 210, 220. The phase rotators may be switchable. For example, the phase rotators may be switched depending on the selected source of the LO signal.

The coupling device 230 may be implemented as a transmission line coupler, for example, in the form of microstrip line, coplanar waveguide line, etc. The coupling device 230 may be implemented as a waveguide coupler, for example in substrate integrated waveguide form or air filled waveguide form. The coupling device 230 may be provided on a PCB (printed circuit board) to which the transceivers are mounted.

Although the coupling device 230 shown in FIG. 2 is a branch line coupler, other types of directional coupler may be used. For example, a rat race or hybrid ring coupler, in which the two output signals are the sum and difference respectively of the two input signals, may also be used to distribute an LO signal arriving at either one of the inputs of the coupling device to both outputs of the coupling device.

The coupling device 230 enables a common LO signal for the radar system 200 to be sourced from any one of the plurality of transceivers 210, 220. As a result, either one of the first and second transceivers 210, 220 may be configured as a master IC, with the other one of the first and second transceivers 210, 220 being configured as a slave IC.

For example, in a first configuration of the radar system 200, the first transceiver 210 is configured as master IC, such that it generates a first common local oscillator (LO) signal. The common LO signal generated by the first transceiver 210 as master IC is output from the LO output port 212 of the master IC 210 and thereby coupled to the first input 232 of the coupling device 230. The coupling device 230 couples the common LO signal from the first transceiver 210 to both the first and second outputs 236, 238 of the coupling device 230, from which the LO signal is coupled to both the LO input port 214 of the first transceiver 210 and the LO input port 224 of the second transceiver 220. In this first configuration of the radar system 200, the second transceiver 220 is configured as slave IC, such that the LO output port 222 of the second transceiver 220 is disabled, and the second transceiver uses the common LO signal received via the coupling device 230 from the first transceiver 210 at its LO input port 224.

In a second configuration of the radar system 200, the second transceiver 220 is configured as master IC such that it generates a second common local oscillator (LO) signal. The common LO signal generated by the second transceiver 220 as master IC is output from the LO output port 222 of the second transceiver 220 and thereby coupled to the second input 234 of the coupling device 230. The coupling device 230 couples the common LO signal from the second transceiver 220 to both the first and second outputs 236, 238 of the coupling device 230, from which the LO signal is coupled to both the LO input port 214 of the first transceiver 210 and the LO input port 224 of the second transceiver 220. In this second configuration of the radar system 200, the first transceiver 210 is configured as slave IC, such that the LO output port 212 of the first transceiver 210 is disabled, and the first transceiver 210 uses the common LO signal received via the coupling device 230 from the second transceiver 220 at its LO input port 214.

During operation of the radar system 200 (e.g. for acquisition of radar data), only one (i.e. the master) of the first and second transceivers 210, 220 is configured to output a LO signal from its respective LO output port 212, 222. The LO output port of the other transceiver (i.e. the slave) of the first and second transceivers 110, 120 is disabled, for example by switching off the VCO/PLL block at chip level. Therefore, only one of the input ports 232, 242 of the coupling device 230 receives a signal.

The radar system 200 may be reconfigured between the first and second configurations described above. The first and second transceivers 210, 220 may be ICs identical to each other in structure and functionality, with each transceiver 210, 220 being selectively (re-)configurable to operate as master or slave.

Each of the first and second transceivers 210, 220, when configured as master IC, may also transmit other signals (not shown) to the slave IC, such as a common clock signal, used as a time base for synchronization of the sampling moments of the ADCs on the master and slave ICs, and timing control signals, for example for triggering a timing engine within the slave IC. Typically, the radar system 200 also includes other components (not shown), such as a crystal oscillator for providing a reference clock signal for the radar system 200, and a controller for controlling the data acquisition process for the radar system 200 and receiving data from the master and slave ICs.

The local oscillator (LO) signal used by the radar system 200 may have a frequency of, for example, around 38 GHz. The present invention provides a means for distributing an LO signal generated by any one of the transceivers (i.e. the transceiver configured as master) to the other transceiver(s) of the radar system (i.e. the transceivers configured as slaves). The other coherent signals, such as the common clock signal, timing control signals, and reference clock signal, typically have frequencies in the range from around 40 MHz to around 300 MHz. Distribution of these other coherent signals between master and slave ICs may be implemented using switches (e.g. multiplexers) or buffers (for example in a separate IC) to build configurability, but is outside the scope of this disclosure.

Figure 3:
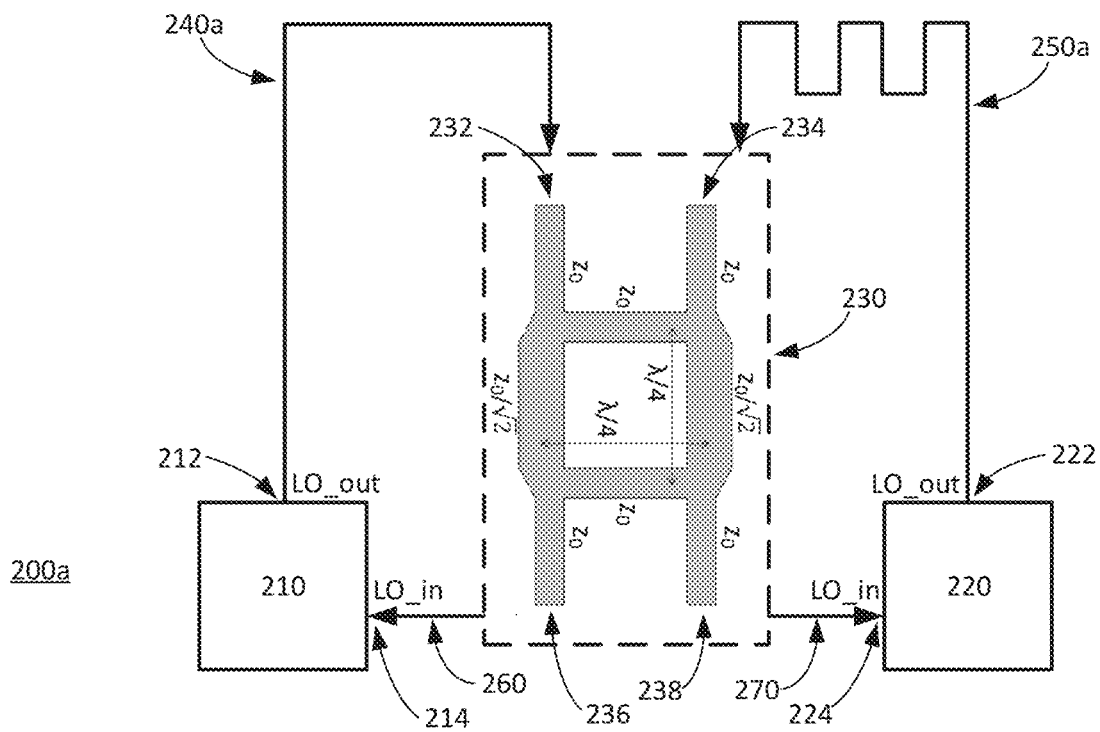
FIG. 3 illustrates a configuration of a radar system according to another example embodiment of the present invention.

FIG. 3 shows another example configuration of a radar system 200a according to an embodiment of the present invention. The system 200a comprises a first IC 210 in the form of a first transceiver, a second IC 220 in the form or a second transceiver, and a coupling device 230, which are the same as the corresponding elements of the radar system 200 described above and illustrated in FIG. 2. The first and second outputs 236, 238 of the coupling device 230 are coupled to the LO input ports 214, 224 of the first and second transceivers 210, 212 respectively, in the same manner as for the system 200 illustrated in FIG. 2.

The radar system 200a of FIG. 3 differs from the radar system 200 of FIG. 2 in that the LO output port 212 of the first transceiver 210 is coupled to the first input 232 of the coupling device 230 via first circuitry in the form of a first delay line 240a, and the LO output port 222 of the second transceiver 220 is coupled to the second input 234 of the coupling device 230 via second circuitry in the form of a second delay line 250a.

The first and second delay lines 240a, 250a have different characteristics, such that an LO signal generated by the first transceiver 210 arrives at the first input 232 of the coupling device 230 with a first delay or phase shift, while an LO signal generated by the second transceiver 212 arrives at the second input 234 of the coupling device 230 with a second delay or phase shift, which is different from the first delay or phase shift.

By implementing different delay lines 240a, 240b for the LO signals in one radar system 200a, it is possible for the system 200a to be adapted for different applications. For example, in an automotive radar system, one delay line may be adapted for use in provision of bumper effects compensation, while another delay line may be adapted for use in provision of ground reflection compensation, and so on. In the radar system 200a of FIG. 3, the desired delay line 240a, 250a may be selected by configuring the corresponding transceiver 210, 220 as the source of the LO signal, i.e. as the master transceiver. For example, the second delay line 250a may be selected by configuring the second transceiver 220 as master, and the first transceiver 210 as slave. The common LO signal for the system 200a is then provided by the second transceiver 220 via the second delay line 250a. The system 200a may subsequently be reconfigured for use in a different application by reconfiguring the second transceiver 220 as slave and the first transceiver 210 as master, such that the common LO signal for the system 200a is provided by the first transceiver 210 via the first delay line 240a.

The radar system 200, 200a described above with reference to FIGS. 2 and 3 can be extended to a system comprising more than two transceivers. In a system comprising a plurality of transceivers and a coupling device, the coupling device comprises a corresponding plurality inputs and a corresponding plurality of outputs. Each input of the coupling device is coupled to the LO output of a respective transceiver, and each output of the coupling device is coupled to the LO input of a respective transceiver. A signal arriving at any one of the plurality of inputs of the coupling device is distributed to each of the plurality of outputs of the coupling device. Thereby, any one of the plurality of transceivers may be configured as master, for outputting the common LO signal, with the other transceivers being configured as slaves and receiving the common LO signal.

Figure 4:
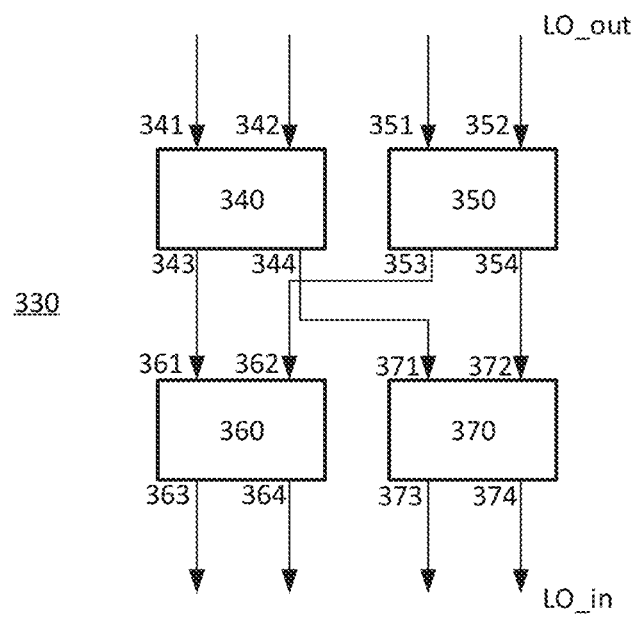
FIG. 4 illustrates a coupling device comprising a plurality of directional couplers for use in a radar system according to a further example embodiment of the present invention.

In such a system, the coupling device may comprises a plurality of directional couplers. As an example, FIG. 4 illustrates a coupling device 330 comprising four directional couplers 340, 350, 360, 370, for use in distributing the LO signal in a radar system according to another example embodiment of the invention and comprising four reconfigurable transceivers. A first directional coupler 340 comprises two inputs 341, 342 and two outputs, 343, 344. A second directional coupler 350 comprises two inputs 351, 352 and two outputs 353, 354. A third directional coupler 360 comprises two inputs 361, 362 and two outputs 363, 364. A fourth directional coupler 370 comprises two inputs 371, 372 and two outputs 373, 374. The inputs 341, 342, 351, 352 of the first and second directional couplers 340, 350 provide the four inputs of the coupling device 330 and are coupled to the respective LO output ports of four transceivers (not shown). One output 343, 353 of each of the first and second directional couplers 340, 350 is coupled to a respective input 361, 362 of the third directional coupler 360. The other output 344, 354 of each of the first and second directional couplers 340, 350 is coupled to a respective input 371, 372 of the fourth directional coupler 370. The outputs 363, 364, 373, 374 of the third and fourth directional couplers 360, 370 provide the four outputs of the coupling device 330 and are coupled to the respective LO input ports of the four transceivers (not shown). A signal arriving at any one of the plurality of inputs 341, 342, 351, 352 of the coupling device 330 is distributed to each of the plurality of outputs 363, 364, 373, 374 of the coupling device 330 and thereby to all the respective LO input ports of the plurality of transceivers.

Reconfigurability of the radar system described above provides several system level benefits. For example, the system 200 may be reconfigured from the first to the second configurations described above in response to a fault occurring in the first IC 210, for example a fault in a VCO block of the first IC while configured as master. The second IC 220 may then take over the function of master IC for the system 200. This enables the system 200 to continue to function, with the second IC 220 providing the common LO signal for the system 200. It may still be possible for the first IC 210 to function as a slave, in addition to any other slave ICs included in the system. This improves the reliability of the system 200.

The radar system 200 also enables thermal dissipation and power consumption to be balanced between the various transceivers. The master IC typically consumes more power and generates more heat than each of the slave ICs. By switching the function of master IC between different ICs of the radar system, heat dissipation may be improved. In addition, system performance, such as SNR (signal to noise ratio), is related to the power consumption, and may therefore be improved by switching the function of master IC between different ICs of the radar system.

System performance may also be improved by selecting the master IC from the plurality of ICs based on performance, which may vary between the ICs, for example due to process variations during manufacture.

Although particular embodiments of the invention have been described above, it will be appreciated than many modifications, including additions and/or substitutions, may be made within the scope of the appended claims.

The invention claimed is:

1. A radar system comprising: a plurality of integrated circuits ICs, each IC comprising:
a respective local oscillator LO output for selectively outputting a respective LO signal, and a respective LO input; and a coupling device, the coupling device comprising:
a plurality of inputs, each input being coupled to the LO output of a respective IC, and a plurality of outputs, each output being coupled to the LO input of a respective IC;
wherein the coupling device is configured such that a LO signal arriving at any one of said plurality of inputs is distributed to each of said plurality of outputs.

2. The radar system of claim 1, wherein said coupling device comprises at least one directional coupler.

3. The radar system of claim 2, wherein said at least one directional coupler comprises at least one of a branch line coupler or a rat race coupler.

4. The radar system of claim 1, wherein said coupling device comprises at least one waveguide coupler.

5. The radar system of claim 1, wherein said coupling device comprises a plurality of directional couplers.

6. The radar system of claim 1, configured such that only one of said plurality of ICs outputs a respective LO signal when the radar system is in use acquiring radar data.

7. The radar system of claim 1, wherein:
each one of said plurality of ICs is selectively configurable (i) as a master IC configured to output a common LO signal at its respective LO output and (ii) as a slave IC configured to receive the common LO signal from the master IC via said coupling device at its respective LO input.

8. The radar system of claim 1, wherein each IC of said plurality of ICs is a transceiver IC or is comprised in a transceiver, receiver or transmitter chipset.

9. The radar system of claim 1, further comprising phase compensation circuitry for compensating a phase difference between the outputs of the coupling device.

10. The radar system of claim 9, wherein said phase compensation circuitry comprises at least one delay line.

11. The radar system of claim 9, wherein said phase compensation circuitry comprises at least one phase rotator.

12. The radar system of claim 1, further comprising:
first circuitry for introducing a first phase shift into a signal received at a first respective input of the plurality of inputs of the coupling device from a first IC of the plurality of ICs, and
second circuitry for introducing a second phase shift into a signal received at a second respective input of the plurality of inputs of the coupling device from a second IC of the plurality of ICs,
wherein said second phase shift is greater than said first phase shift.

13. The radar system of claim 12, wherein said first and second circuitry comprises respective first and second delay lines.

14. An autonomous vehicle comprising a radar system, the radar system comprising:
a plurality of integrated circuits ICs, each IC comprising:
a respective local oscillator LO output for selectively outputting a respective LO signal, and
a respective LO input; and a coupling device, the coupling device comprising:
a plurality of inputs, each input being coupled to the LO output of a respective IC, and a plurality of outputs, each output being coupled to the LO input of a respective IC;
wherein the coupling device is configured such that a LO signal arriving at any one of said plurality of inputs is distributed to each of said plurality of outputs.

15. A method of operating a radar system, the radar system comprising: a plurality of radar integrated circuits ICs, each IC comprising a respective local oscillator LO output for selectively outputting a respective LO signal, and a respective LO input; and a coupling device, the coupling device comprising: a plurality of inputs, each input being coupled to the LO output of a respective IC, and a plurality of outputs, each output being coupled to the LO input of a respective IC;
wherein the coupling device is configured such that a LO signal arriving at any one of said plurality of inputs is distributed to each of said plurality of outputs; the method comprising:
operating the radar system in a first configuration, in which a first IC of said plurality of ICs is configured to output a common LO signal, and the other ICs of said plurality of ICs are configured to receive said common LO signal from said first IC;
and reconfiguring the radar system to a second configuration, in which a second IC of said plurality of ICs is reconfigured to output a common LO signal.

16. The method of claim 15, further comprising outputting a respective LO signal by only one of said plurality of radar ICs when the radar system is in use acquiring radar data.

17. The method of claim 15, wherein each IC of said plurality of radar ICs is a transceiver IC or is comprised in a transceiver, receiver or transmitter chipset.

18. The method of claim 15, further comprising compensating by way of phase compensation circuitry a phase difference between the outputs of the coupling device.

19. The method of claim 15, further comprising:
introducing a first phase shift into a signal received at a first respective input of the plurality of inputs of the coupling device from a first radar IC of the plurality of radar ICs; and introducing a second phase shift greater than said first phase shift into a signal received at a second respective input of the plurality of inputs of the coupling device from a second radar IC of the plurality of radar ICs.

20. The method of claim 15, wherein said coupling device comprises at least one directional coupler, the directional coupler comprising at least one of a branch line coupler or a rat race coupler.

* * * * *